(12) United States Patent
Schmideder et al.

(10) Patent No.: US 9,144,155 B2
(45) Date of Patent: Sep. 22, 2015

(54) SENSOR COMPRISING A MULTI-LAYERED CERAMIC SUBSTRATE AND METHOD FOR ITS PRODUCTION

(75) Inventors: Sabine Schmideder, Wurmannsquick (DE); Torsten Thelemann, Arnstadt (DE); Josef Nagl, Kuenzing (DE); Heinrich Aschenbrenner, Ortenburg (DE); Reinhold Hoenicka, Ortenburg (DE)

(73) Assignee: MICRO-EPSILON Messtechnik GmbH & Co. KG, Ortenburg (DE)

( * ) Notice: Subject to any disclaimer, the term of this patent is extended or adjusted under 35 U.S.C. 154(b) by 267 days.

(21) Appl. No.: 13/880,348

(22) PCT Filed: Oct. 10, 2011

(86) PCT No.: PCT/DE2011/050042
§ 371 (c)(1),
(2), (4) Date: Apr. 18, 2013

(87) PCT Pub. No.: WO2012/072070
PCT Pub. Date: Jun. 7, 2012

(65) Prior Publication Data
US 2013/0223031 A1 Aug. 29, 2013

(30) Foreign Application Priority Data

Dec. 2, 2010 (DE) .......................... 10 2010 053 021
Dec. 8, 2010 (DE) .......................... 10 2010 053 760

(51) Int. Cl.
*H05K 7/10* (2006.01)
*H05K 1/18* (2006.01)
(Continued)

(52) U.S. Cl.
CPC .............. *H05K 1/181* (2013.01); *B81B 7/0006* (2013.01); *B81C 1/00301* (2013.01); *H05K 3/32* (2013.01);
(Continued)

(58) Field of Classification Search
CPC ....... H05K 3/32; H05K 1/181; H05K 3/4046; H05K 3/4629; H05K 1/165; H05K 2201/10318; H05K 1/0306; H05K 3/3447; H05K 1/162; H05K 2201/10356; H05K 2201/10303; H05K 2201/10151; H05K 2201/10287; H05K 1/185; B81B 7/0006; B81B 2207/096; B81B 2207/092; B81C 1/00301; H01L 2924/0002; Y10T 29/49128
USPC .......... 174/259, 262–263; 361/760, 761, 767, 361/779
See application file for complete search history.

(56) References Cited

U.S. PATENT DOCUMENTS 3,941,916 A  3/1976 Morse
4,340,901 A * 7/1982 Anazawa et al. ............. 257/693
(Continued)

FOREIGN PATENT DOCUMENTS

CN  101680813 A  3/2010
CN  101903286 A  12/2010
(Continued)

OTHER PUBLICATIONS

International Searching Authority, International Search Report for International Application No. PCT/DE2011/050042, mailed Jun. 4, 2012, 6 pages, European Patent Office, Germany.
(Continued)

*Primary Examiner* — Hoa C Nguyen
(74) *Attorney, Agent, or Firm* — Alston & Bird LLP

(57) ABSTRACT

A sensor comprises a preferably multi-layer ceramic substrate (2) and at least one sensor element (1) arranged in, at, or on the ceramic substrate (2). The sensor element (1) can be contacted via a metallic contact (6), with the metallic contact (6) being produced via a soldering connection, which electrically connects the contact (6) with the sensor element (1) and here generates a fixed mechanic connection of the contact (6) in reference to the ceramic substrate (2). Furthermore, a method is claimed for producing the sensor according to the invention.

16 Claims, 3 Drawing Sheets

Figure 1:
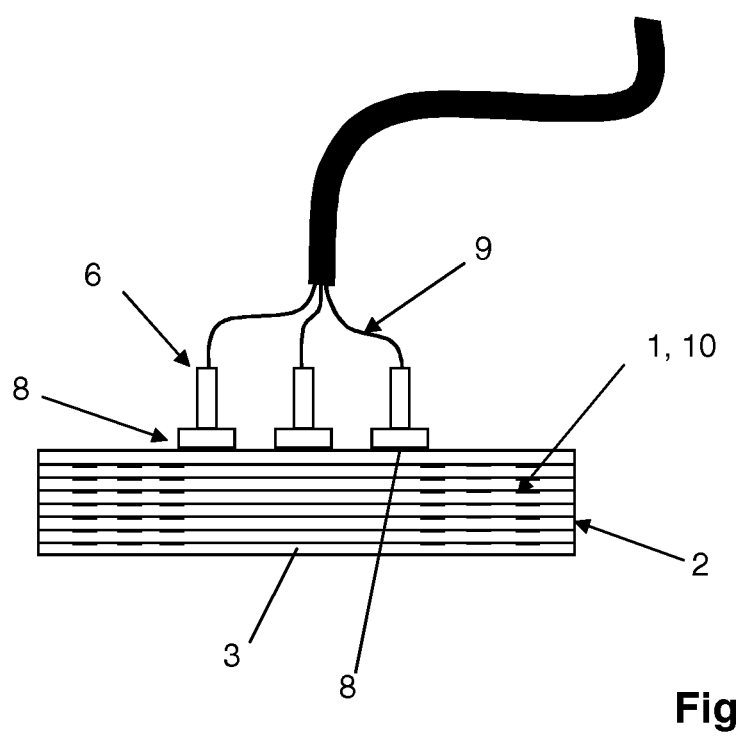

(51) Int. Cl.
- *B81B 7/00* (2006.01)
- *B81C 1/00* (2006.01)
- *H05K 3/40* (2006.01)
- *H05K 3/32* (2006.01)
- *H05K 1/03* (2006.01)
- *H05K 3/34* (2006.01)
- *H05K 3/46* (2006.01)
- *H05K 1/16* (2006.01)

(52) U.S. Cl.
CPC ......... *H05K 3/4046* (2013.01); *B81B 2207/092* (2013.01); *B81B 2207/096* (2013.01); *H01L 2924/0002* (2013.01); *H05K 1/0306* (2013.01); *H05K 1/162* (2013.01); *H05K 1/165* (2013.01); *H05K 1/185* (2013.01); *H05K 3/3447* (2013.01); *H05K 3/4629* (2013.01); *H05K 2201/10151* (2013.01); *H05K 2201/10287* (2013.01); *H05K 2201/10303* (2013.01); *H05K 2201/10318* (2013.01); *H05K 2201/10356* (2013.01); *Y10T 29/49128* (2015.01)

(56) References Cited

U.S. PATENT DOCUMENTS

| | | | | |
|---|---|---|---|---|
| 4,598,470 | A | * | 7/1986 | Dougherty et al. ............. 29/837 |
| 5,194,697 | A | * | 3/1993 | Hegner et al. ................. 174/151 |
| 5,196,251 | A | * | 3/1993 | Bakhru et al. .................. 428/76 |
| 5,266,522 | A | * | 11/1993 | DiGiacomo et al. .......... 438/612 |
| 5,368,220 | A | | 11/1994 | Mizuhara et al. |
| 5,539,611 | A | * | 7/1996 | Hegner et al. .............. 361/283.4 |
| 6,008,980 | A | * | 12/1999 | Stevenson et al. ............ 361/302 |
| 6,648,211 | B2 | * | 11/2003 | Saiki et al. ................. 228/180.1 |
| 6,765,779 | B2 | * | 7/2004 | Stevenson et al. ............ 361/302 |
| 6,985,347 | B2 | * | 1/2006 | Stevenson et al. ............ 361/302 |
| 7,012,192 | B2 | * | 3/2006 | Stevenson et al. ............ 174/538 |
| 2004/0201464 | A1 | | 10/2004 | Oonishi |
| 2006/0219564 | A1 | * | 10/2006 | Feng ............................... 205/81 |
| 2010/0000768 | A1 | * | 1/2010 | Maeda et al. ................. 174/255 |
| 2011/0012248 | A1 | | 1/2011 | Reichenbach et al. |
| 2011/0100120 | A1 | | 5/2011 | Neuburger et al. |

FOREIGN PATENT DOCUMENTS

| | | |
|---|---|---|
| DE | 19825451 A1 | 12/1999 |
| DE | 10314875 A1 | 11/2004 |
| DE | 102004024920 A1 | 12/2005 |
| DE | 102004063598 A1 | 7/2006 |
| DE | 102004024920 B4 | 6/2009 |
| DE | 102008016829 A1 | 10/2009 |
| DE | 102008043567 A1 | 5/2010 |
| EP | 1443331 A2 | 8/2004 |
| WO | WO 2008148779 A1 | 12/2008 |

OTHER PUBLICATIONS

International Searching Authority, Written Opinion for International Application No. PCT/DE2011/050042, mailed Jun. 4, 2012, 5 pages, European Patent Office, Germany.

The International Bureau of WIPO, Advance E-Mail: International Preliminary Report on Patentability, including translation of the International Searching Authority's Written Opinion for International Application No. PCT/DE2011/050042, mailed Jun. 13, 2003, 9 pages, Switzerland.

\* cited by examiner

SENSOR COMPRISING A MULTI-LAYERED CERAMIC SUBSTRATE AND METHOD FOR ITS PRODUCTION

CROSS REFERENCE TO RELATED APPLICATIONS

This application is a national stage application, filed under 35 U.S.C. §371, of International Application No. PCT/DE2011/050042, filed Oct. 10, 2011, which claims priority to and the benefit of German Application No. 10 2010 053 021.2, filed Dec. 2, 2010, and German Application No. 10 2010 053 760.8, filed Dec. 8, 2010, the contents of all of which are hereby incorporated by reference in their entirety.

BACKGROUND

1. Technical Field

In general, the invention relates to a sensor preferably comprising a multi-layered ceramic substrate with at least one sensor element being arranged and/or embodied in, at, or on the ceramic substrate. Further, the invention relates to a method for the production of such a sensor.

While electronic assemblies have previously been produced on conventional circuit boards, today they are increasingly generated on and/or in ceramic substrates. The use of ceramics shows several advantages at once. Here, the high temperature resistance of ceramics is of particular importance. Additionally, the expansion of ceramics is considerably lower over the temperature progression than circuit boards of the prior art. Additionally, it is possible to produce multi-layered ceramics with integrated conductors in and/or between said layers. It is even possible to implement electric/electronic components between these layers. This leads to an extremely compact design. The contacting of such electronic assemblies commonly occurs via so-called soldering pads printed onto the substrate. In soft soldering methods of the prior art the contact is soldered onto the soldering pads in the form of a strand, metal wire, or the like. Soft welding is disadvantageous in that the soldering tin used already melts at temperatures from 200° C. to 300° C. This eliminates the enormous advantage of the high temperature resistance of ceramics, which cannot be utilized when the conventional soldering tin is used for soft soldering.

2. Description of Related Art

Solderings of the prior art are also disadvantageous, since in the connection to the solder pad is an exclusively electric connection. Such a connection is extremely unstable with regards to mechanic stress. Accordingly, the soldering site may not be subjected to any considerable mechanic stress. In case of shock, vibration, or other mechanic stress such soldering sites frequently break or tear. Consequently a separate mechanic fixation is required, for example by adhesion, joining, etc.

Hard soldering methods are an alternative to conventional soft soldering, with here the soldering temperature exceeding 450° C. Active brazing is a particular form of hard soldering. Commercial active brazing shows a melting point of approx. 850° C. Additionally, it shows the advantage that via active brazing metal the brazing process can occur directly on the ceramic. The conventional metallization of the ceramics required in conventional soft soldering or hard soldering can be omitted for active brazing, because the solder enters into a direct connection with the surface of the ceramics due to its chemical composition. By adding specific soldering elements, such as titanium, a reaction develops in active brazing at the boundary, namely between the metal and/or the metal alloy of the solder and the surface of the ceramic, so that the materials directly connect to each other without any adhesive agents being interposed. The particular advantage of active brazing is therefore given in the high mechanic resistance and high temperature stability of the connection. Consequently, a metal-ceramics connection suitable for high temperatures can be produced by active brazing.

Sensors of a generic type are known in practice. Such sensors already exist comprising multi-layered ceramics. For example, reference is made here to DE 10 2008 016 829 A1 and DE 103 14 875 A1.

In the sensors in question the connection between metal and ceramics represents a particular problem, too. Due to the fact that the actual sensor element is usually arranged on or in the ceramic and/or the ceramic substrate and for example at least one measuring electrode or at least one measuring coil must be contacted electrically, in general there is the problem how such an electric connection can be generated flawlessly and lastingly while simultaneously generate sufficiently good mechanic connections.

Usually, metallic contacts for sensors are also applied on ceramics, for example by way of soldering. Per se, such metal-ceramic soldering connections are also known from the prior art. Here, reference is made to DE 10 2004 024 920 B4. Concretely, from DE 10 2004 024 920 B4 a pressure sensor is known, in which a ceramic substrate is connected via active or hard soldering to a support structure made from metal, connected fixed to the connection housing of the pressure sensor. Here, it is disadvantageous that the ceramic substrate only serves as a fastening device for the actual pressure measuring cell. This pressure measuring cell in turn is made from metal and connected to the ceramic substrate by way of active brazing on one side. On the other side the ceramic substrate is provided with connection pins.

The measures of the prior art for electric contacting sensors are problematic in practice, however, since on the one hand they cause considerable expenses in handling/production and on the other hand they are only conditionally resistant to external-mechanical-influences. Such contacts generated by soldering are extremely "sensitive" and thus subject to malfunction.

BRIEF SUMMARY

The present invention is therefore based on the objective to provide a sensor or a sensor design in which the sensor element is arranged and/or respectively produced at, on, or in a preferably multi-layered ceramic substrate and in which secure contacting of the sensor element is realized with the most simple technology. Additionally, the sensor shall be designed as simple as possible and thus producible in a cost-effective fashion.

The above objective is attained with regards to the sensors according to the invention in the features of claim 1. Accordingly, the generic sensor comprises the actual sensor element in, at, or on a ceramic substrate and an electric contacting, generated by way of soldering, in the form of a metallic contact, with the soldered connection being designed such that on the one side it electrically contacts the metallic contact to the sensor element and on the other side forms a secure mechanic connection between the metallic contact and the ceramic substrate. Consequently, the method according to the invention has provided a secure, solid soldering connection both with regards to electric as well as mechanic aspects with a surprisingly simple design. With regards to the method according to the invention the present invention is attained in the features of the dependent claim 9, which relates to the production of the sensor according to the invention.

In case of an inductive distance or position sensor the sensor element may comprise one or more coils. For a capacitive distance measurement one or more electrode areas are possible as integral components. In force or pressure sensors the sensor element may comprise expansion elements of any design. For temperature sensors the sensor element comprises resistance layers. For magneto-resistant sensors the sensor element may be included in the substrates as a silicon component. Additional other sensor elements are possible. Here, it shall be pointed out that this relates to the general sensor design, however not the implementation of a concrete sensor element.

The use of active brazing in the sensor systems is particularly advantageous. Sensors must frequently be used under particularly adverse environmental conditions, for example at high temperatures or under the stress from shock and vibrations. A weak point of the sensors is their connection, i.e. the cable. The connection between the metallic strand of the cable to the electronic components of the sensor can easily be damaged under stress from shock or vibration. Here, the use of active brazing is particularly suitable to simultaneously create sensors with high temperature stability and high resistance against mechanic stress.

In the simplest case, the ceramic substrate comprises a single layer made from ceramics. In this case, the sensor element is applied on the surface of the substrate. The contacting of the sensor element occurs commonly by conductors applied on the substrate by way of printing technology of the prior art, for example. It is particularly advantageous to use multi-layered ceramic substrates which are connected to each other in a fixed manner by way of sintering. The sensor elements may be applied in the individual layers of the substrate, for example the coil of a distance sensor by way of printing layers of conductors. After the stacking of the individual layers and the sintering process a massive ceramic block develops, which comprises the sensor elements in its interior. This way, they are protected from environmental influences and are mechanically stable.

The contacting of the sensor element on the ceramic substrate is implemented such that by way of active brazing of a suitable metal connection part on the ceramic substrate simultaneously an electrically conductive and mechanically stable connection develops. This occurs such that on the one hand the support area of the contact on the ceramic substrate simultaneously covers the electric contacting area, for example the conductors or the soldering pad, and on the other hand covers the exposed ceramic surface. During the soldering process then simultaneously both the electric connection is implemented between the contact area and the metallic contact as well as the mechanic connection to the ceramic surface and the contact.

Further, the metallic contact can advantageously be connected directly on/in the ceramic substrate with said substrate. The metallic contact may be embodied in the form of a bolt/pin inserted into the ceramic substrate, so that already by said inserting of the contact a certain positional stability is achieved, perhaps even by realizing a certain fitting.

The metallic contact can advantageously be sized such that it is inserted into the ceramic substrate with at least little play, i.e. without realizing a pressure fitting. The gap forming between the contact and the ceramic substrate can here be designed such that the active brazing and/or the soldering paste is distributed evenly and sufficiently in the gap, with here precise dosage of the soldering paste in the gap being advantageous, if possible prior to inserting the metallic contact.

In another advantageous manner the measuring electrode or measuring coil to be contacted by the metallic contact is provided inside or on the side of the ceramic substrate opposite the insert side. Further, a material promoting electric contacts, preferably a contact paste, is provided between the measuring electrode and/or measuring coil and the metallic contact in an advantageous manner. This is preferably applied on the measuring electrode or measuring coil to be contacted prior to sintering the ceramic substrate so that in the subsequent active brazing, at a temperature of approx. 850° C., an excellent electric as well as mechanic connection can be produced to the metallic contact.

In light of the previous explanations not only a flawless electric contacting is realized between the metallic contact and the contact area of the sensor element, for example a measuring electrode or measuring coil of the sensor element, but also a flawless mechanic anchoring and/or fastening of the metallic contact in and/or at the ceramic substrate.

The method according to the invention serves to produce the above-discussed sensor and is essentially based on the fact that the ceramic substrate is produced by way of sintering technology and the metallic contact, which serves for the electric contacting is inserted after the sintering of the ceramic substrate into it and here soldered by way of active brazing both for the purpose of electric contacting as well as for the mechanic anchoring.

A material promoting the electric contact, for example in the form of a contact paste, may be inserted prior to sintering the ceramic substrates into said substrate.

DETAILED DESCRIPTION OF THE DRAWINGS

There are various options to embody and further develop the teaching of the present invention in an advantageous manner. For this purpose, reference is made, on the one hand, to the claims dependent on claim 1 and, on the other hand, to the following explanation of preferred exemplary embodiments of the invention, based on the drawing. Generally preferred embodiments and further developments of the teaching are explained based on the drawing and in connection with the explanation of preferred exemplary embodiments of the invention. The drawing shows FIG. 1 in a schematic view, partially cross-sectioned, the general structure of a sensor according to the invention, FIG. 2 in a schematic view, cross-sectioned and (showing) a detail, another exemplary embodiment of a sensor according to the invention in the area of contacting, and FIG. 3 in a schematic view, cross-sectioned and (showing) a detail, a sensor according to the invention in the area of contacting.

DETAILED DESCRIPTION OF VARIOUS EMBODIMENTS

FIG. 1 shows a first exemplary embodiment of a sensor according to the invention, in which the metal connection part is embodied as a pin 6 with a contact surface serving for fastening. The contact surface forms the contact area for the ceramic substrate 2, with them being connected to each other via active brazing 8. The support area of the contact is embodied such that on the one hand, on the ceramic substrate 2 it simultaneously covers the electric contact area, for example the conductor or the soldering pad, and on the other hand, the exposed ceramic surface. During the soldering process then both the mechanic connection with the ceramic surface and the contact and the electric connection between the contact area and the metallic contact are simultaneously produced.

During the production the ceramic substrate 2 is covered with the active brazing 8. Subsequently the pin 6 is fixated via a suitable device on the ceramic substrate 2. During the heating process the active brazing 8 connects with the metal via a chemical reaction, on the one hand, and with the ceramics, on the other hand, with this generating a fixed structural connection between metal and ceramics. Due to the fact that the active brazing 8 is also electrically conductive here an electric connection is generated between the pin 6 and the conductors on the ceramic substrate. Then, a cable 9, a wire, or other electric connections may be applied at the pin 6 in a conventional fashion. This in turn may occur via soldering, or in case of particularly high temperature requirements, by welding or crimping.

Figure 2:
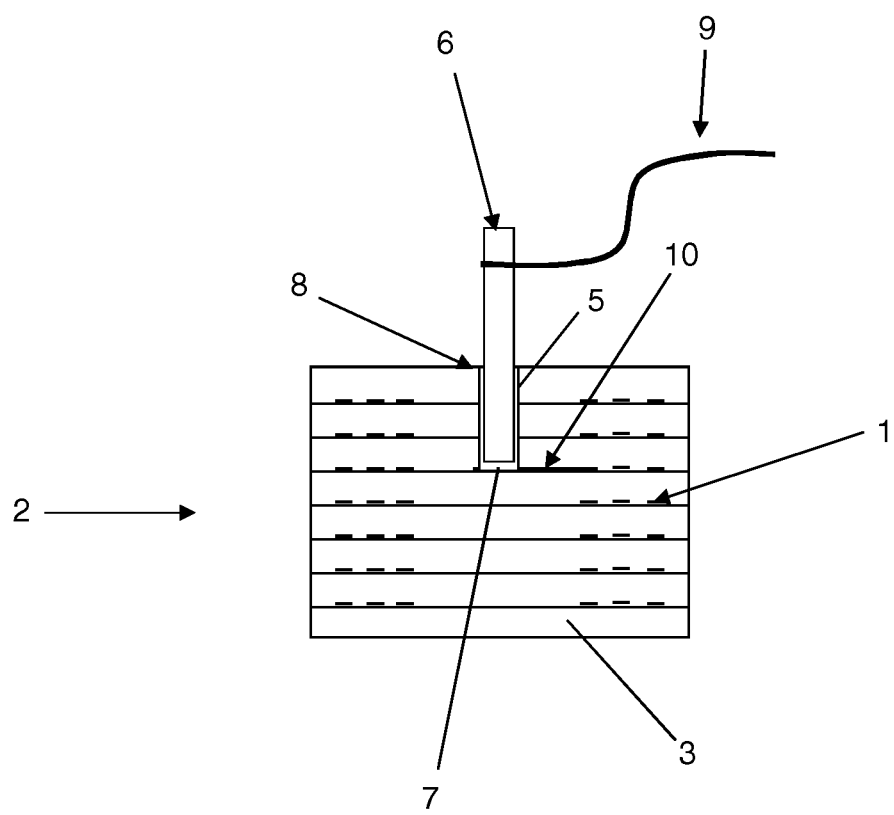

FIG. 2 shows another embodiment of a sensor according to the invention in which the metal-connection element is inserted in the form of a metal pin 6 into a recess 7 of the ceramic substrate 2. The ceramic layers are appropriately processed in the still compressed but unsintered state (in the so-called green state), thus provided with penetrations, which then form so-called cavities. Such processes are also used in the so-called vias (through connections) in multi-layered ceramic substrates. In order to produce through connections between the ceramic layers small holes are punched into the initially still soft substrate. These holes are filled with a conductive contact paste 5. After the stacking and sintering of the layers the conductive paste 5 connects the surface of the layer with the bottom and thus generates a through connection between the conductors located on the upper side of one layer with the conductors located at the bottom. This through connection can also extend over several layers. During the stacking process it must only be observed that the layers are precisely aligned over top of each other. If penetrations extend over several layers to the surface of the sensor substrate a recess (cavity) develops at the surface in the form of a blind hole. After the sintering process, common ceramic layers show a thickness of approx. 200 μm, for example. If the via extends over three layers a blind hole develops with a depth of approx. 600 μm.

The metal pin 6 can be inserted into this blind hole and connected by way of active brazing 8 with the ceramic substrate 2. A conductive connection develops in the via by soldering the metal pin 6 inside the ceramic substrate 2 and the conductive layer, which simultaneously is particularly stable mechanically. The mechanic stability is also achieved not only by the boundary layer of the active brazing 8 but additionally by the insertion of the pin 6 into the ceramic substrate 2. This way, the contact area between the pin 6 and the ceramic is enlarged without here it being necessary that large contact areas are provided on the surface of the ceramic. This is particularly advantageous when the ceramic substrate 2 itself covers a small area. Additionally, the mechanic stability against lateral stress is increased by said insertion. This way, the pin 6 cannot brake off, for example when tension is applied in the lateral direction to the cable welded thereon.

Particularly advantageous for the use of the metal-connection parts, for example in the form of a metal pin 6, are titanium, kovar, or zirconium. After the sintering process, the ceramic substrates 2 show a thermal expansion coefficient of 5-7 ppm/K. The expansion coefficient of titanium amounts to 9 ppm/K, kovar 5.3 ppm/K, and zirconium 5.9 ppm/K. The use of metals with similar or even identical expansion coefficients, such as ceramics, is therefore advantageous in that at high temperatures none or only minor tension develops at the active brazing site. High temperatures initially develop during the brazing process itself, which occurs for example at 850° C. When the material cools after brazing, due to the very different expansion coefficients at the connection site, strong internal mechanic tension can develop between the metal-connection part and the ceramic, which in the worst case scenario leads to the soldering site breaking off. Furthermore, high temperatures may develop in the environmental conditions of the sensors, because such sensors are particularly suitable for such high temperature applications. The use of materials with similar expansion coefficients adjusted to each other is therefore particularly important for the stability of the metal-ceramic connection.

Figure 3:
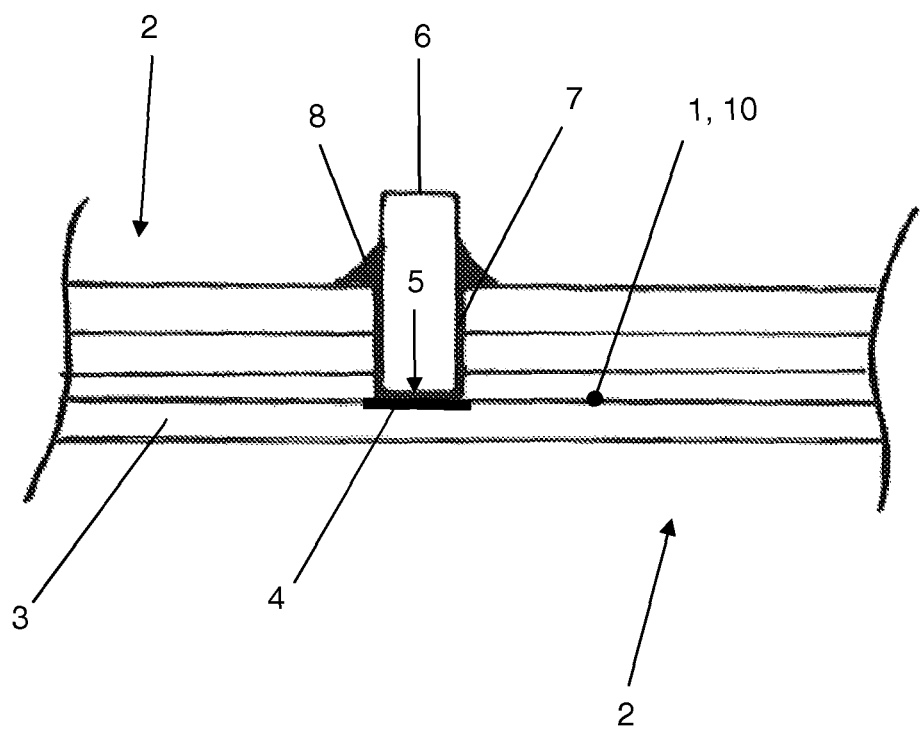

FIG. 3 shows in a schematic side view, cross-sectioned, the multi-layered ceramic substrate 2 comprising the sensor element 1, with the sensor and/or the sensor element 1 being produced from multi-layered ceramics. A housing, not shown here, may be made from metal or at least comprise a metallic brim, frame, or the like.

In FIG. 3 it is indicated that the lowermost layer 3, which comprises the measuring electrode 4 and/or the measuring coil, is covered with a contact paste 5, which is inserted into the ceramic substrate 2 prior to sintering. The metallic contact in the form of a metallic pin 6 is inserted into a bore hole/recess 7 in the ceramic substrate 2, with a flawless electric contacting occurring by the effect of the contact paste 5 in reference to the measuring electrode 4 and/or the measuring coil.

FIG. 3 discloses that the metal pin 6 is directly soldered into the multi-layered ceramic substrate 2, i.e. by way of active brazing, so that by the active brazing both an electric contacting is implemented with the help of contact paste 5 as well as a mechanic connection in reference to the ceramic substrate 2. The active brazing 8 leads to an electric as well as a solid mechanic connection.

Particular advantages of the sensors according to the invention develop as follows:
- simultaneously electrically conductive and mechanically stable connection
- active brazing suitable for high temperatures
- sensor elements encapsulated in the ceramic substrate
- compact design by little space required for contacting
- no mechanic stress due to material selected
- sensor element robust against environmental influences (temperature, dirt, water, chemical influences, etc.)
- production of a metal-ceramic connection without using the elements lead and tin, which due to toxicity may not be used for example in some fields of application.

With regards to additional advantageous embodiments of the device according to the invention and the method according to the invention reference is made to the general part of the description as well as the attached claims, in order to avoid repetitions.

Finally, it shall be explicitly pointed out that the above-described exemplary embodiments of the device according to the invention only serve to explain the claimed teaching, however are not limited to the exemplary embodiments.

LIST OF REFERENCE CHARACTERS

1 Sensor element
2 Ceramic substrate
3 lowermost layer
4 Measuring electrode, electrode area
5 Contact paste
6 Contact, pin, metal pin
7 Bore hole/recess 8 Active brazing
9 Cable, wire
10 Conductor within 2

The invention claimed is:

1. Sensor comprising a multi-layered ceramic substrate (2) and at least one sensor element (1), arranged at least one of in, at, and on the ceramic substrate (2), which can be contacted via a metallic contact (6), with the metallic contact (6) being produced by a solder connection, which electrically connects the metallic contact (6) with the sensor element (1) and generates a fixed mechanical connection of the metallic contact (6) in reference to the ceramic substrate (2), wherein the sensor element (1) serves for at least one of an inductive and capacitive path/distance/position measurement, with the contacting being formed at least one of in reference to one or more coils and in reference to one or more electrode areas (4), wherein the metallic contact (6) is embodied as at least one of a pin, a bolt, or the like inserted into a blind hole in the ceramic substrate (2), wherein an end of the metallic contact (6) is facing a layer of the multi-layered ceramic surface carrying a conductor, and wherein the metallic contact (6) is electrically connected to the conductor.

2. A sensor according to claim 1, wherein the sensor element (1) is embodied as at least one of a force sensor, a pressure sensor, a temperature sensor, and a magneto-resistant sensor, with the contacting being embodied in reference to one or more expansion elements, resistance elements, and silicon components.

3. A sensor according to claim 1, wherein the metallic contact (6) is directly connected on the ceramic substrate (2) with said substrate by way of active brazing.

4. A sensor according to claim 1, wherein the metallic contact (6) is directly connected in the ceramic substrate (2) with said substrate by way of active brazing.

5. A sensor according to claim 1, wherein the metallic contact (6) is sized such that it can be inserted with little play into the ceramic substrate (2) up to the contacting sensor element (1), with active brazing (8) sufficiently and here to the extent possible evenly fills out any potentially clear space between the ceramic substrate (2) and the metallic contact (6).

6. A sensor according to claim 1, wherein the sensor element (1) to be contacted by the metallic contact (6) is arranged inside of the ceramic substrate (2) opposite the metallic contact (6), with a material promoting the electric contacting being arranged between the sensor element (1) and the metallic contact (6).

7. A sensor according to claim 6, wherein the material promoting the electric contacting is a contact paste (5) being arranged between the sensor element (1) and the metallic contact (6).

8. A sensor according to claim 1, wherein the sensor element (1) to be contacted by the metallic contact (6) is arranged on the side of the ceramic substrate (2) opposite the metallic contact (6), with a material promoting the electric contacting being arranged between the sensor element (1) and the metallic contact (6).

9. A sensor according to claim 8, wherein the material promoting the electric contacting is a contact paste (5) being arranged between the sensor element (1) and the metallic contact (6).

10. A sensor according to claim 1, wherein the ceramic substrate (2) is produced by way of sinter technology, with a material promoting the electric contacting being applied prior to the actual sintering on the area of the sensor element (1) to be contacted.

11. A sensor according to claim 10, wherein the material promoting the electric contacting is a contact paste (5) being applied prior to the actual sintering on the area of the sensor element (1) to be contacted.

12. A sensor according to claim 1, wherein the ceramic substrate (2) is produced by way of sinter technology, with a material promoting the electric contacting being inserted in the ceramic substrate (2).

13. A sensor according to claim 12, wherein the material promoting the electric contacting is a contact paste (5) being inserted in the ceramic substrate (2).

14. A method for the production of a sensor according to claim 1, with at least one sensor element (1) being generated at least one of on, at, and in a multi-layered ceramic substrate (2) and serving for at least one of an inductive path/distance/position measurement, wherein the multi-layered substrate (2) is produced by sintering and with both for the electric contacting as well as for the mechanic connection of a metallic contact (6) it is inserted into a blind hole in the ceramic substrate (2) by way of active brazing and is connected fixed with the ceramic substrate (2).

15. A method according to claim 14, wherein the contacting of the sensor element (1) is promoted such that prior to sintering the ceramic substrate (2) a material is inserted into the inside of the ceramic substrate (2) promoting the electric contact, preferably in the form of a contact paste (5).

16. A method according to claim 15, wherein the material is a contact paste (5).

* * * * *